United States Patent
Gu et al.

(10) Patent No.: US 6,510,543 B1
(45) Date of Patent: Jan. 21, 2003

(54) METHOD AND APPARATUS FOR RENDERING AN IC DESIGN LAYOUT EMPLOYING GRAPHICS FILES AT LOW ZOOM-IN FACTORS

(75) Inventors: Ke-Qin Gu, San Jose, CA (US); Tsung-Yen (Eric) Chen, Fremont, CA (US); Ching-Chih (Jason) Han, Fremont, CA (US); Kuo-Chun Lee, Fremont, CA (US)

(73) Assignee: Oridus, Inc., Fremont, CA (US)

( * ) Notice: Subject to any disclaimer, the term of this patent is extended or adjusted under 35 U.S.C. 154(b) by 162 days.

(21) Appl. No.: 09/678,514

(22) Filed: Oct. 3, 2000

(51) Int. Cl.[7] .............................................. G06F 9/455
(52) U.S. Cl. ................................ 716/11; 716/2; 703/14
(58) Field of Search ....................... 716/1–21; 703/14; 705/27; 250/332; 326/43; 345/502

(56) References Cited

U.S. PATENT DOCUMENTS 5,625,568 A * 4/1997 Edwards et al. ............... 716/2
6,236,956 B1 * 5/2001 Mantooth et al. ............ 703/14

* cited by examiner

Primary Examiner—Vuthe Siek
Assistant Examiner—H Rossoshek
(74) Attorney, Agent, or Firm—Victor H. Okumoto

(57) ABSTRACT

A method and apparatus for rendering an integrated circuit design layout is described. Graphics files are generated for selected zoom-in factors from cell-based information of the integrated circuit design, and stored in memory. When a computer operator selects a zoom-in factor greater by a predetermined amount than the largest of such selected zoom-in factors, a selector enables a rendering engine to render the integrated circuit design layout from the cell-based information. On the other hand, when the computer operator selects a zoom-in factor less than the largest of such selected zoom-in factors plus the predetermined amount, the selector enables a graphics processor to render the integrated circuit design layout from appropriate ones of the graphics files.

18 Claims, 5 Drawing Sheets

METHOD AND APPARATUS FOR RENDERING AN IC DESIGN LAYOUT EMPLOYING GRAPHICS FILES AT LOW ZOOM-IN FACTORS

FIELD OF THE INVENTION

The present invention generally relates to methods of rendering images on a computer screen and in particular, to a method and apparatus for rendering an integrated circuit ("IC") design layout.

BACKGROUND OF THE INVENTION

FIG. 1 illustrates a block diagram of a prior art system for rendering an integrated circuit design layout from cell-based information. The cell-based information in. this case is stored in GDS-II format in a GDS-II database 101. A rendering engine 102 renders the integrated circuit design layout from the cell-based information by reading the cell-based information from the GDS-II database 101, processing the cell-based information for a given zoom-in factor, and transmitting the processed information to a frame buffer 103 of a computer display screen. A computer operator viewing the integrated circuit design layout on the computer display screen selects the zoom-in factor.

One problem with such prior art system, however, is the time that it takes to render integrated circuit design layouts at low zoom-in factors on the computer screen. In particular, as integrated circuit devices pack more and more transistors on a chip, the rendering time gets increasingly slower to the point of being highly objectionable to the computer operator. This is because as more and more transistors are packed on a chip, the rendering engine must process more and more cells in the cell-based structure in order to render the integrated circuit design layout at low zoom-in factors.

OBJECTS AND SUMMARY OF THE INVENTION

Accordingly, it is an object of the present invention to provide a method and apparatus for rendering an integrated circuit design layout that is relatively faster than prior art techniques.

Another object is to provide a method and apparatus for rendering an integrated circuit design layout that is relatively faster than prior art techniques at low zoom-in factors.

These and additional objects are accomplished by the various aspects of the present invention, wherein briefly stated, one aspect of the invention is a method of rendering an integrated circuit design layout, comprising: receiving a zoom-in factor; if the zoom-in factor is greater than a first number, then rendering an integrated circuit design layout by processing cell-based information of the integrated circuit design; and if the zoom-in factor is less than the first number, then rendering the integrated circuit design layout from at least a first graphics image of the integrated design layout.

Another aspect of the invention is an apparatus for rendering an integrated circuit design layout. The apparatus comprises a memory and at least one processor. The memory includes a first graphics file indicative of the integrated circuit design layout at a first selected zoom-in factor. The at least one processor includes a graphics processor, a rendering engine and a selector. The graphics processor serves to render the integrated circuit design layout from at least the first graphics file. The rendering engine serves to render the integrated circuit design layout from cell-based information. The selector serves to enable either the graphics processor or the rendering engine depending upon a received zoom-in factor. If the received zoom-in factor is less than the first selected zoom-in factor, then the selector enables the graphics processor. On the other hand, if the received zoom-in factor is greater than the first selected zoom-in factor, then the selector enables the rendering engine.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
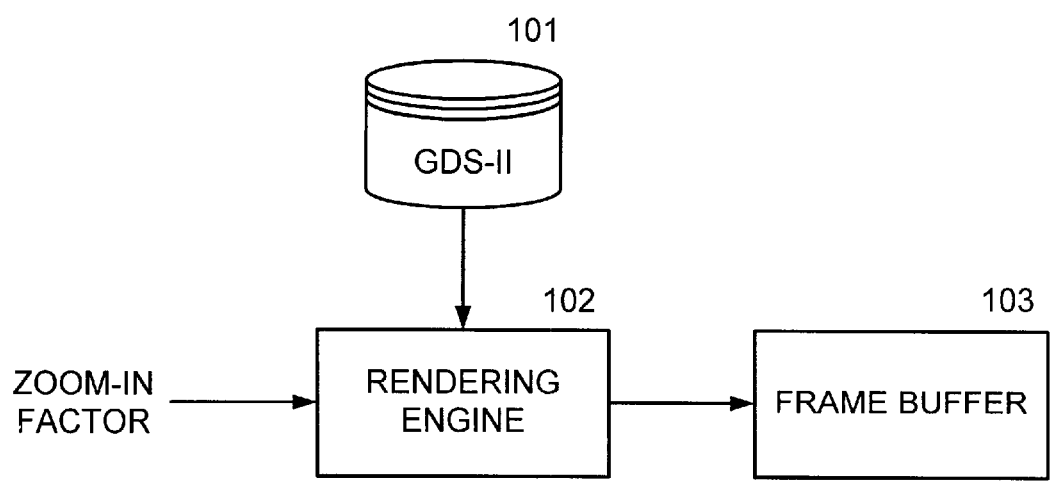
FIG. 1 illustrates a block diagram of a prior art system for rendering an integrated circuit design layout from cell-based information.
Figure 2:
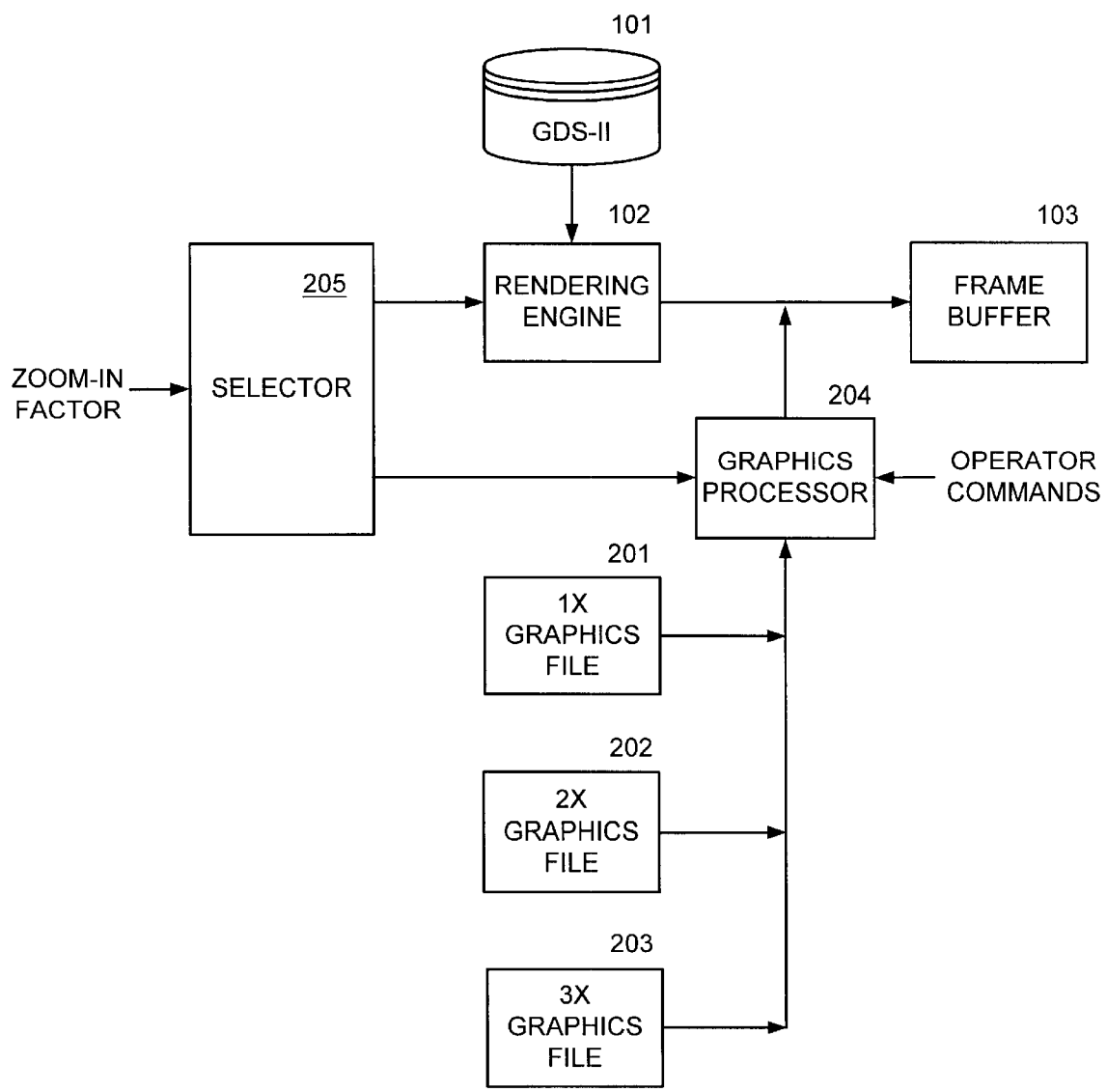
FIG. 2 illustrates a block diagram of a system for rendering an integrated circuit design layout, utilizing aspects of the present invention.

FIG. 2 illustrates a block diagram of a system for rendering an integrated circuit design layout. Cell-based information for the integrated circuit design layout is stored in database 101. The cell-based information may be in a conventional hierarchical structure or a flattened structure. Due to the prevalence of GDS-II as a format in the semiconductor industry for conveying integrated circuit design layout information for mask generation, the cell-based information is preferably in the GDS-II format. Alternatively, however, the cell-based information may be in other commonly used formats such as CIF.

When it is enabled, a rendering engine 102 renders the integrated circuit design layout in a conventional fashion from the cell-based information by reading the cell-based information from the GDS-II database 101, processing the cell-based information for a given zoom-in factor, and transmitting the processed information to a frame buffer 103 of a computer display screen. The zoom-in factor in this case is provided by a computer operator viewing the integrated circuit design layout on the computer display screen.

Graphics files 201, 202 and 203 store information of the integrated circuit design layout at selected zoom-in factors. In this example, graphics file 201 stores information of the integrated circuit design layout for a 1.0 times (1×) zoom-in factor, graphics file 202 stores information for a 2.0 times (2×) zoom-in factor, and graphics file 203 stores information for a 3.0 times (3×) zoom-in factor. The information may be at the mask level, or at a composite level. Since it is assumed for the purposes of this example, that enlargements greater than an incremental 1× would be objectionable to a computer operator from a viewing standpoint, the graphics files 201, 202 and 203 represent 1× increments from each other. The information stored in the graphics files 201, 202 and 203 is in one of a number of conventional formats such as BMP, GIF, JPEG, PCX and TIF.

When it is enabled, a graphics processor 204 renders the integrated circuit design layout by reading information stored in appropriate ones of the graphics files 201, 202 and 203, processing the information, and transmitting the processed information to the frame buffer 103. If the information stored in the graphics files 201, 202 and 203 are at the mask level, then the graphics processor combines the information to form a composite top view of the integrated circuit design layout. The graphics processor 204 operates on the information stored in the graphics files 201, 202 and 203 in a conventional manner in response to computer operator provided zoom-in commands specified as zoom-in factors, as well as other instructions received from the computer operator such as cut, paste and pan to manipulate the current view of the integrated circuit design layout on the computer display screen.

A selector 205 receives the zoom-in factor provided by the computer operator, and enables either the rendering engine 102 or the graphics processor 204 depending upon the size or magnitude of the zoom-in factor. In the preferred embodiment, if the zoom-in factor is greater than 4×, then the selector enables the rendering engine 102 to render the integrated circuit design layout, and passes the zoom-in factor to the rendering engine 102. On the other hand, if the zoom-in factor is less than 4×, then the selector 205 enables the graphics processor 204 to render the integrated circuit design layout from one or more of the graphics files 201, 202 and 203, and passes the zoom-in factor to the graphics processor 204.

For example, if the computer operator enters a zoom-in factor equal to 1×, then the selector 205 enables the graphics processor 204 to render the integrated circuit design layout from the graphics file 201. On the other hand, if the computer operator enters a zoom-in factor equal to 2.5× in the preferred embodiment, then the selector 205 enables the graphics processor 204 to render the integrated circuit design layout from the graphics file 202. The graphics processor 204 then operates to enlarge a graphics image generated from the graphics file 202 in a conventional graphics processing fashion to the zoom-in factor of 2.5×.

The GDS-II database 101 and the graphics files 201, 202 and 203 are stored in a memory. (not shown). Due to the large amount of information to be stored, the memory is preferably a mass storage device such as a hard disk. The rendering engine 102, graphics processor 204 and selector 205 functions are performed by one or more processors (not shown) as commonly found in engineering workstations and personal computers.

Figure 3:
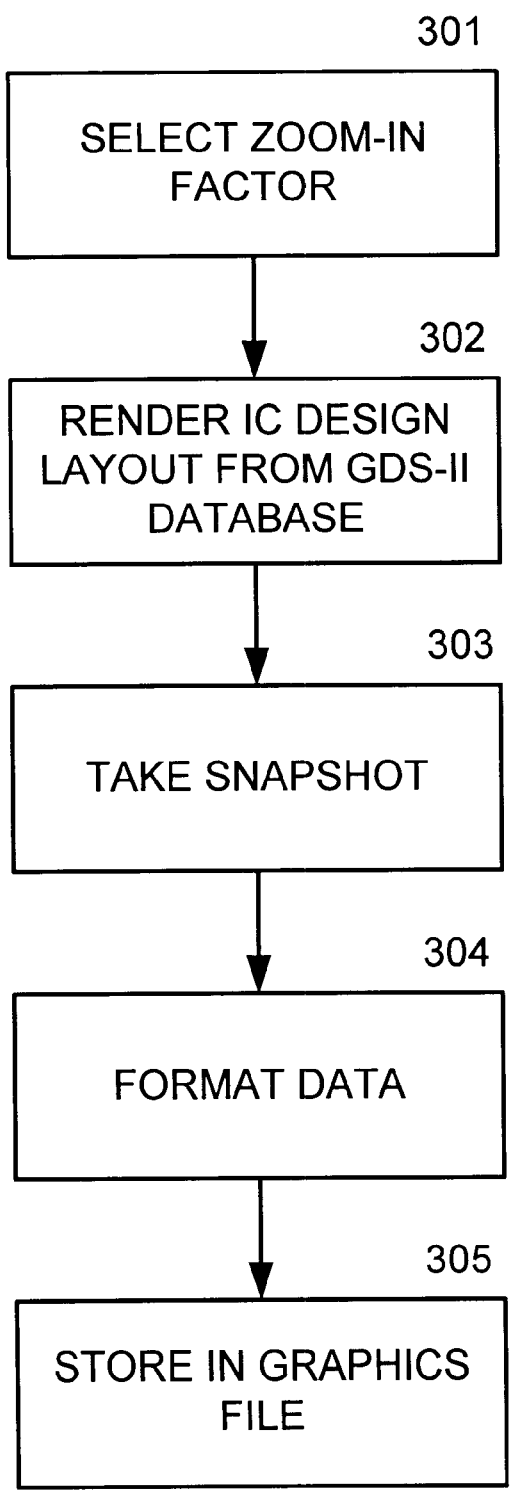
FIG. 3 illustrates a flow diagram of a method of generating graphics files for selected zoom-in factors from cell-based information of an integrated circuit design layout, utilizing aspects of the present invention.

FIG. 3 illustrates a flow diagram of a method of generating graphics files for selected zoom-in factors from cell-based information of an integrated circuit design layout. It is necessarily performed prior to rendering the integrated circuit design layout by the methods described in reference to FIGS. 4 and FIG. 5, and is generally performed only once for multiple of such renderings of the integrated circuit design layout.

In 301, a first zoom-in factor such as 3× is selected by a computer operator, and provided to the rendering engine 102. In 302, the rendering engine 102 renders the integrated circuit device layout corresponding to the zoom-in factor 3× by conventionally processing the information stored in the GDS-II database 101. In 303, after the integrated circuit device layout is stored in the frame buffer 103, a snapshot program (not shown) conventionally captures the pixel information for the graphics image displayed on the computer display screen. In 304, a formatting program (not shown) conventionally converts the graphics image into a format such as BMP, GIF, JPEG, PCX and TIF. In 305, the formatted information is then stored in the 3× graphics file 203. By repeating 301 to 305 for second and third zoom-in factors such as 2× and 1×, corresponding formatted information are stored in 2× and 1× graphics files 202 and 201.

Figure 4:
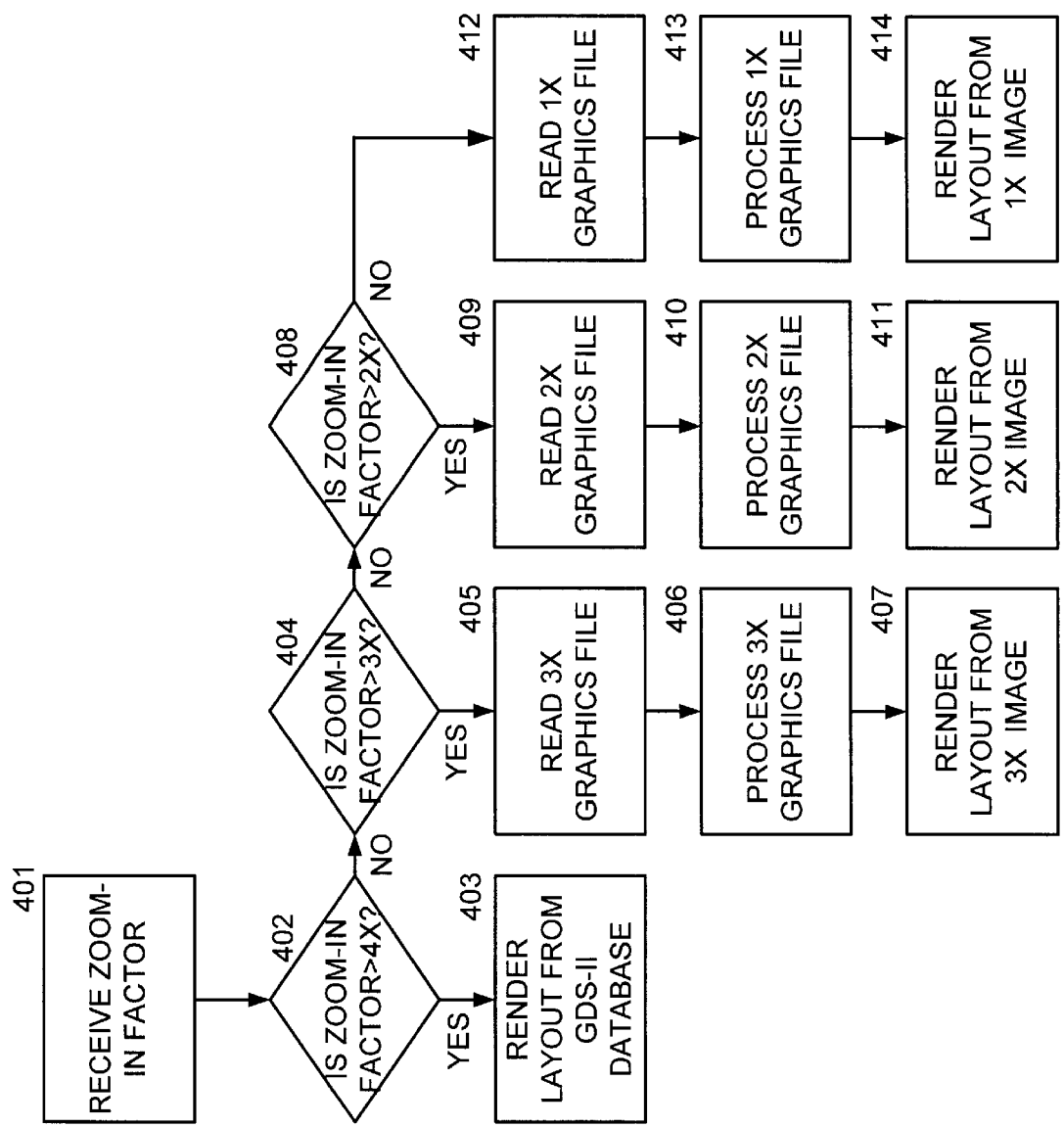
FIG. 4 illustrates a flow diagram of a preferred method of rendering an integrated circuit design layout, utilizing aspects of the present invention.

FIG. 4 illustrates a flow diagram of a preferred method of rendering an integrated circuit design layout. In 401, the selector 205 receives a zoom-in factor from a computer operator. In 402, the selector determines whether the zoom-in factor is greater than 4×. The zoom-in factor of 4× is chosen as a limit in this case, because it is a 1× increment over the largest zoom-in factor associated with the graphics files 201, 202 and 203, and it is assumed for the purposes of this example that enlargements greater than a 1× increment would be objectionable to the computer operator from a viewing standpoint. If the answer to 402 is YES, then the selector 205 enables the rendering engine 102, and passes the received zoom-in factor to the enabled rendering engine 102. In 403, the rendering engine 102 then renders the integrated circuit design layout by processing cell-based information of the integrated circuit design layout stored in the GDS-II database 101 according to the received zoom-in factor. On the other hand, if the answer to 402 is NO, then the selector 205 enables the graphics processor 204, and passes the received zoom-in factor to the enabled graphics processor 204.

In 404, the graphics processor 204 then determines whether the zoom-in factor is greater than 3×. If the answer is YES, then in 405, the graphics processor 204 reads the information stored in the 3× graphics file 203; in 406, processes the information to generate a 3× graphics image of the integrated circuit design layout; and in 407 renders the processed graphics image by transmitting it to the frame buffer 103 after enlarging it to the received zoom-in factor by conventional graphics processing techniques. On the other hand, if the answer is NO, then in 408, the graphics processor 204 next determines whether the zoom-in factor is greater than 2×. If the answer is YES, then in 409, the graphics processor 204 reads the information stored in the 2× graphics file 202; in 410, processes the information to generate a 2× graphics image of the integrated circuit design layout; and in 411 renders the processed graphics image by transmitting it to the frame buffer 103 after enlarging it to the received zoom-in factor by conventional graphics processing techniques. On the other hand, if the answer is NO, then in 412, the graphics processor 204 reads the information stored in the 1× graphics file, 201; in 413, processes the information to generate a 1× graphics image of the integrated circuit design layout; and in 414 renders the processed graphics image by transmitting it to the frame buffer 103 after enlarging it to the received zoom-in factor by conventional graphics processing techniques.

Figure 5:
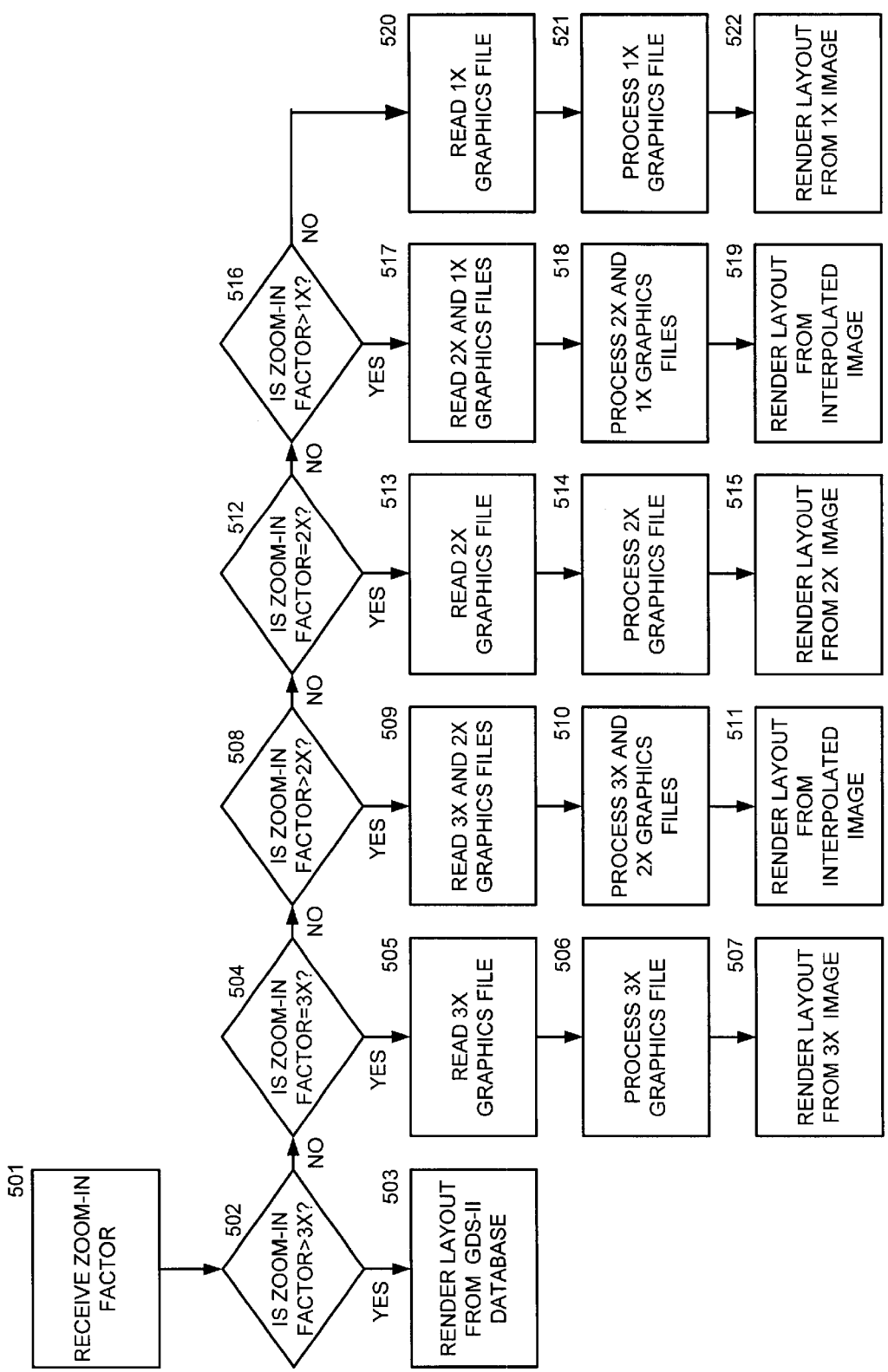
FIG. 5 illustrates a flow diagram of an alternative method of rendering an integrated circuit design layout, utilizing aspects of the present invention.

FIG. 5 illustrates a flow diagram of an alternative method of rendering an integrated circuit design layout. This alternative method sacrifices some speed relative to the preferred method in exchange for enhanced sharpness in enlarged graphics images of the integrated circuit design layout. In 501, the selector 205 receives a zoom-in factor from a computer operator. In 502, the selector determines whether the zoom-in factor is greater than 3×. If the answer is YES, then the selector 205 enables the rendering engine 102, and passes the received zoom-in factor to the enabled rendering engine 102. In 503, the rendering engine 102 then renders the integrated circuit design layout by processing cell-based information of the integrated circuit design layout stored in the GDS-II database 101 according to the received zoom-in factor. On the other hand, if the answer is NO, then the selector 205 enables the graphics processor 204, and passes the received zoom-in factor to the enabled graphics processor 204.

In 504, the graphics processor 204 then determines whether the zoom-in factor is equal to 3×. If the answer is YES, then in 505, the graphics processor 204 reads the information stored in the 3× graphics file 203; in 506, processes the information to generate a 3× graphics image of the integrated circuit design layout; and in 507 renders the processed graphics image by transmitting it to the frame buffer 103. On the other hand, if the answer is NO, then in 508, the graphics processor 204 next determines whether the zoom-in factor is greater than 2×. If the answer in this case is YES, then in 509, the graphics processor 204 reads the information stored in the 3× graphics file 203 and the 2× graphics file 202; in 510, processes the information to generate 3× and 2× graphics images of the integrated circuit design layout; and in 511 renders an interpolated graphics image from the 3× and 2× graphics images by transmitting it to the frame buffer 103. The interpolation in this case being performed linearly from the two graphics images. For even more enhanced sharpness in enlarged graphics images of the integrated circuit design layout, non-linear interpolation techniques may be used by performing 509, 510 and 511 with more than two graphics files.

On the other hand, if the answer to 508 is NO, then in 512, the graphics processor 204 determines whether the zoom-in factor is equal to 2×. If the answer is YES, then in 513, the graphics processor 204 reads the information stored in the 2× graphics file 202; in 514, processes the information to generate a 2× graphics image of the integrated circuit design layout; and in 515 renders the processed graphics image by transmitting it to the frame buffer 103. On the other hand, if the answer is NO, then in 516, the graphics processor 204 next determines whether the zoom-in factor is greater than 1×. If the answer in this case is YES, then in 517, the graphics processor 204 reads the information stored in the 2× graphics file 202 and the 1× graphics file 201; in 518, processes the information to generate 2× and 1× graphics images of the integrated circuit design layout; and in 519 renders an interpolated graphics image from the 2× and 1× graphics images by transmitting it to the frame buffer 103. Finally, if the answer to 516 is NO, then in 520, the graphics processor 204 reads the information stored in the 1× graphics file 201; in 521, processes the information to generate a 1× graphics image of the integrated circuit design layout; and in 522 renders the processed graphics image by transmitting it to the frame buffer 103.

Although the various aspects of the present invention have been described with respect to a preferred embodiment, it will be understood that the invention is entitled to full protection within the full scope of the appended claims.

We claim:

1. A method of rendering an integrated circuit design layout, comprising:
    receiving a zoom-in factor,
    if said zoom-in actor is greater than a first number, then rendering an integrated circuit design layout by processing cell-based information of said integrated circuit design; and
    if said zoom-in factor is less than said first number, then rendering said integrated circuit design layout from at least a first graphics file generated from a first graphics image of said integrated circuit design layout.

2. The method according to claim 1, wherein said cell-based information is in hierarchical structure.

3. The method according to claim 2, wherein said cell-based information is in GDS-II format.

4. The method according to claim 1, further comprising: generating said first graphics image from said cell-based information prior to receiving said zoom-in factor.

5. The method according to claim 1, wherein said first graphics file is in GIF format.

6. The method according to claim 1, further comprising: if said zoom-in factor is less than a second number that is less than said first number, then rendering said integrated circuit design layout from at least a second graphics file generated from a second graphics image of said integrated circuit design layout.

7. The method according to claim 6, further comprising: generating said first and said second graphics images from said cell-based information of said integrated circuit design prior to receiving said zoom-in factor.

8. The method according to claim 7, wherein said cell-based information is in hierarchical structure.

9. The method according to claim 7, wherein said first and said second graphics files are in GIF format.

10. The method according to claim 7, further comprising:
    if said zoom-in factor is less than said first number and greater than said second number, then rendering said integrated circuit design layout from information in at least said first and said second graphics files; and
    if said zoom-in factor is less than said second number, then rendering said integrated circuit design layout from information in at least said second and a third graphics files.

11. The method according to claim 10, wherein said third graphics file is generated from a third graphics image, and said third graphics image is generated from said cell-based information of said integrated circuit design prior to receiving said zoom-in factor.

12. The method according to claim 11, wherein said first graphics image is indicative of a first zoom-in factor, said second graphics image is indicative of a second zoom-in factor, said third graphics image is indicative of a third zoom-in factor, said first zoom-in factor is greater than said second zoom-in factor, and said second zoom-in factor is greater than said third zoom-in factor.

13. An apparatus for rendering an integrated circuit design layout, comprising:
    a memory including a first graphics file indicative of said integrated circuit design layout at a first selected zoom-in factor; and
    at least one processor including
        a graphics processor for rendering said integrated circuit design layout from at least said first graphics file,
        a rendering engine for rendering said integrated circuit design layout from cell-based information, and
        a selector for receiving a zoom-in factor, and enabling said graphics processor if said received zoom-in factor is less than said first selected zoom-in factor, and enabling said rendering engine if said received zoom-in factor is greater than said first selected zoom-in factor.

14. The apparatus according to claim 13, wherein said cell-based information is in GDS-II format.

15. The apparatus according to claim 13, wherein said first graphics file is in GIF format.

16. The apparatus according to claim 13, wherein said memory further includes a second graphics file indicative of said integrated circuit design layout at a second selected zoom-in factor that is less than said first selected zoom-in factor, and said graphics processor renders said integrated circuit design layout from at least said first graphics file if said received zoom-in factor is less than said selected zoom-in factor and greater than said second selected zoom-in factor, and from at least said second graphics file if said received zoom-in factor is less than said second selected zoom-in factor.

17. The apparatus according to claim 16, wherein said memory further includes a third graphics file indicative of said integrated circuit design layout at a third selected zoom-in factor less than said second selected zoom-in factor, and said graphics processor renders said integrated circuit design layout from at least said first and said second graphics files if said received zoom-in factor is less than said first selected zoom-in factor and greater than said second selected zoom-in factor, and from at least said second and said third graphics files if said received zoom-in factor is less than said second selected zoom-in factor.

18. The apparatus according to claim 17, wherein said graphics processor renders said integrated circuit design layout by generating a first graphics image processed from at least said first and said second graphics files if said received zoom-in factor is less than said selected zoom-in factor and greater than said second selected zoom-in factor, and by generating a second graphics image processed from at least said second and said third graphics files if said received zoom-in factor is less than said second selected zoom-in factor.

* * * * *